(12) United States Patent
Guenther et al.

(10) Patent No.: US 6,949,880 B1
(45) Date of Patent: Sep. 27, 2005

(54) ENCAPSULATION FOR ORGANIC LED DEVICE

(75) Inventors: Ewald Karl Michael Guenther, Singapore (SG); Hagen Klausmann, Munich (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/168,058

(22) PCT Filed: Dec. 17, 1999

(86) PCT No.: PCT/SG99/00143

§ 371 (c)(1),
(2), (4) Date: Sep. 18, 2002

(87) PCT Pub. No.: WO01/45140

PCT Pub. Date: Jun. 21, 2001

(51) Int. Cl.[7] ............. H01J 1/62; H01J 63/04; H01J 9/00; H01J 9/24; B05D 5/06
(52) U.S. Cl. .............. 313/512; 313/504; 313/506; 445/24; 445/25; 427/469
(58) Field of Search .............. 313/512; 445/24, 445/25; 427/469

(56) References Cited

U.S. PATENT DOCUMENTS

| | | | |
|---|---|---|---|
| 4,961,962 A * | 10/1990 | Morimoto | 427/180 |
| 5,385,499 A * | 1/1995 | Ogawa et al. | 445/24 |
| 5,550,408 A | 8/1996 | Kunitomo et al. | |
| 5,552,913 A | 9/1996 | Shimizu et al. | |
| 5,580,619 A | 12/1996 | Sakai et al. | |
| 5,632,663 A * | 5/1997 | Ishihara et al. | 445/25 |
| 5,724,230 A | 3/1998 | Poetzinger | |
| 5,750,258 A * | 5/1998 | Sakai et al. | 428/405 |
| 5,777,386 A | 7/1998 | Higashi et al. | |
| 5,821,692 A | 10/1998 | Rogers et al. | |
| 5,844,315 A | 12/1998 | Melton et al. | |
| 5,900,675 A | 5/1999 | Appelt et al. | |
| 5,939,783 A | 8/1999 | Laine et al. | |
| 6,111,355 A * | 8/2000 | Inoue et al. | 313/506 |
| 6,111,356 A * | 8/2000 | Roitman et al. | 313/506 |
| 6,172,879 B1 | 1/2001 | Cilia et al. | |
| 6,177,729 B1 | 1/2001 | Benenati et al. | |
| 6,232,667 B1 | 5/2001 | Hultmark et al. | |
| 6,259,204 B1 | 7/2001 | Ebisawa et al. | |
| 6,260,264 B1 | 7/2001 | Chen et al. | |
| 6,313,528 B1 | 11/2001 | Solberg | |
| 6,339,254 B1 | 1/2002 | Venkateshwaran et al. | |
| 6,376,917 B1 | 4/2002 | Takeshita et al. | |
| 6,633,124 B2 | 10/2003 | Himeshima et al. | |

(Continued)

FOREIGN PATENT DOCUMENTS

EP           0884792         12/1998

(Continued)

OTHER PUBLICATIONS

Burroughs et al., "Light-emitting diodes based on conjugated polymers", Nature, London, vol. 347, 539-541, 1990, London.

(Continued)

*Primary Examiner*—Joseph Williams
*Assistant Examiner*—Matt Hodges
(74) *Attorney, Agent, or Firm*—Fish & Richardson P.C.

(57) ABSTRACT

An encapsulation for a device is disclosed. Spacer particles are randomly located in the device region to prevent a cap mounted on the substrate from contacting the active components, thereby protecting them from damage.

66 Claims, 6 Drawing Sheets

U.S. PATENT DOCUMENTS 6,649,221 B1 * 11/2003 Tateno et al. ............... 427/469
2003/0094691 A1   5/2003 Auch et al.

FOREIGN PATENT DOCUMENTS

| EP | 0910228 | 4/1999 |
| WO | WO 01/04938 | 1/2001 |
| WO | WO 01/39174 | 5/2001 |
| WO | WO 01/44865 | 6/2001 |
| WO | WO 01/45140 | 6/2001 |

OTHER PUBLICATIONS

Birenda Bahadur (Ed) "Liquid Crystals: Application and Uses", 1990, London, vol. 1, pp. 171-194, 397-436, ISBN 9810201109.

Hayes, D.J. et al., "Low-cost display assembly and interconnect using ink-jet printing technology", Journal of SID (Society for Information Display), Sep. 2001, pp. 9-13.

* cited by examiner

US 6,949,880 B1

ENCAPSULATION FOR ORGANIC LED DEVICE

FIELD OF THE INVENTION

The present invention relates to organic LED (OLED) devices. More particularly, the invention relates to packaging of OLED devices.

BACKGROUND OF THE INVENTION

FIG. 1 shows an OLED device 100. The OLED device comprises one or more organic functional layers 110 between first and second electrodes 105 and 115. The electrodes can be patterned to form, for example, a plurality of OLED cells to create a pixelated OLED device. Bond pads 150, which are coupled to the first and second electrodes, are provided to enable electrical connections to the OLED cells.

To protect the OLED cells from the environment such as moisture and/or air, a cap 160 encapsulates the device. The active and electrode materials of the OLED cells are sensitive and can be easily damaged due to mechanical contact with, for example, the cap. To prevent damage to the OLED cells, a cavity cap or package is used. The cavity package provides a cavity 145 between the cap and OLED cells. The cavity also allows for the placement of desiccant materials to cope with finite leakage rate of the device.

Typically, the lateral dimensions of OLED devices are usually in the range of a few centimeters or more, depending on the applications. Typically, the lateral dimensions are larger for displays or lighting devices. To accommodate the large lateral dimensions, thicker caps are used to provide the necessary mechanical stability to maintain the integrity of the cavity.

However, the demand for thin and flexible devices requires the use of thinner components, such as the cap and the substrate. Decreasing the thickness of the cap reduces its mechanical stability, making it more prone to bending which can cause the cavity to collapse, thereby damaging the OLED cells.

As evidenced from the above discussion, it is desirable to provide an OLED device having improved packaging, particularly those formed on thin or flexible substrates.

SUMMARY OF THE INVENTION

The invention relates to encapsulation for devices such as OLED devices. One or more OLED cells are provided in the device region of the substrate. A cap is mounted on the substrate to encapsulate the device. The cap forms a cavity in the device region, separating it from the OLED cells.

In accordance with the invention, spacer particles are provided in the device region to prevent the cap from contacting the OLED cells. In one embodiment, the spacer particles are randomly deposited on the substrate by spraying techniques. In one embodiment, the spacer particles are deposited by a dry spray technique. Alternatively, a wet spray technique is employed to deposit the spacer particles on the substrate. Spacer particles in the non-device region are removed, leaving the spacer particles randomly distributed in the device region. A cap is mounted on the substrate to encapsulate the device. The spacer particles in the device region prevent the cap from contacting the OLED cells.

PREFERRED EMBODIMENTS OF THE INVENTION

The invention relates generally to OLED devices. In particular, the invention provides a cost-effective package for encapsulating OLED devices, particularly those formed on flexible or thin substrates. In accordance with one embodiment of the invention, spacer particles are provided between the OLED cells and the cap. The spacer particles prevent the cap from contacting the OLED cells.

Figure 1:
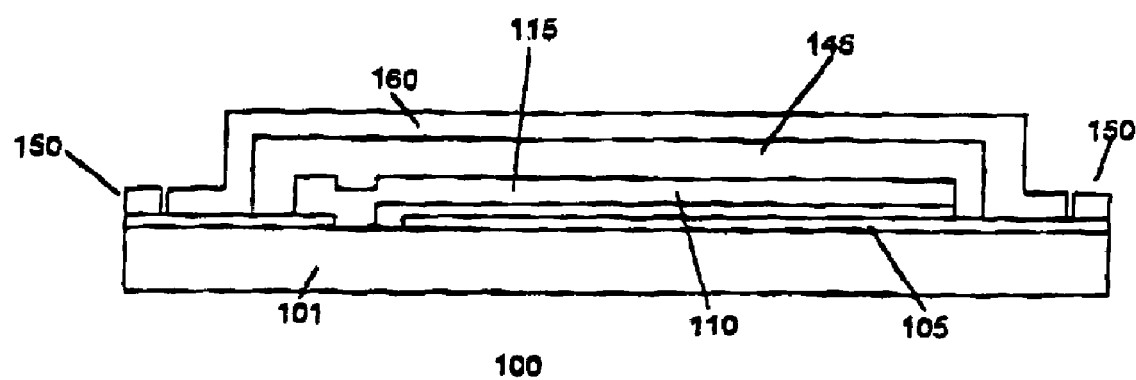
FIG. 1 shows an OLED device.
Figure 2:
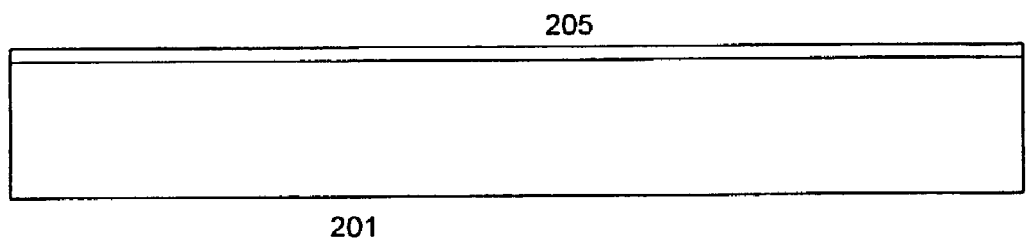
FIGS. 2–6 show a process for forming an OLED device in accordance with one embodiment of the invention.

FIGS. 2–6 show a process for fabricating an OLED device in accordance with one embodiment of the invention. Referring to FIG. 2, a substrate 201 is provided on which OLED cell or cells are formed. The substrate can comprise various types of materials, such as glass or polymer. Other materials which can adequately support the OLED cells are also useful.

In one embodiment, the substrate comprises a flexible material, such as a plastic film for forming a flexible device. Various commercially available plastic films can be used to serve as the substrate. Such films, for example, include transparent poly(ethylene terephthalate) (PET), poly(butylene terephthalate) (PBT), poly(enthylene naphthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS) and poly(m-ethyl methyleacrylate) (PMMA), can also be used to form the substrate. A flexible substrate comprising thin glass or other flexible materials is also useful.

In one embodiment, the substrate is about 20–300 um thick. In some cases, the thin substrate maybe mechanically unstable, creating processing problems. A temporary support layer (not shown) can be employed to stabilize the substrate during the fabrication process. The temporary support layer, for example, can be provided on the backside of the substrate. In one embodiment, the temporary support layer comprises a polymer foil coated with an adhesive for attaching to the substrate. After processing, the temporary layer is removed since the device package can be used to mechanically stabilize the device.

A conductive layer 205 is deposited on the substrate. The substrate can be provided with a barrier layer, such as silicon dioxide ($SiO_2$), beneath the conductive layer on the substrate surface prior to depositing the conductive. Barrier layers are particularly useful for substrates comprising soda lime glass. The barrier layer, for example, is about 20 nm thick. In one embodiment, the conductive layer comprises a transparent conductive material, such as indium-tin-oxide (ITO). Other types of transparent conductive layers, including zinc-oxide and indium-zinc-oxide, are also useful. Various techniques, such as chemical vapor deposition (CVD) physical vapor deposition (PVD), and plasma enhanced CVD (PECVD), can be employed to form the device layer. The conductive layer should be thin to reduce optical absorption and negative impact on subsequent film formation while satisfying electrical requirements. The conductive layer is typically about 0.02–1 $\mu$m thick.

Figure 3:
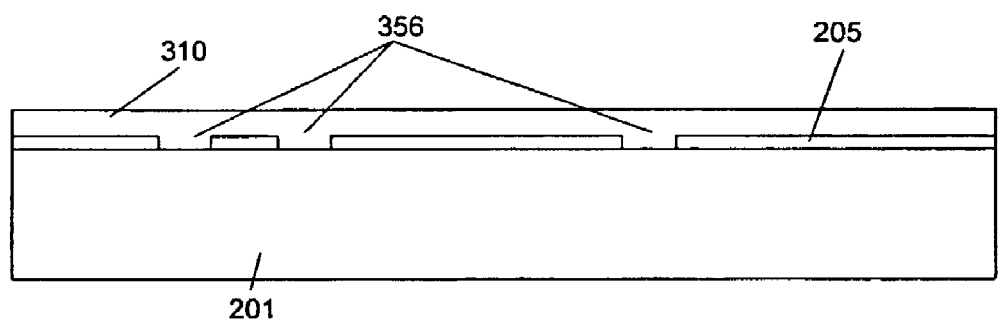

Referring to FIG. 3, the conductive layer 205 is patterned as desired to selectively remove portions of the layer, exposing portions 356 of the substrate. The patterned conductive layer serves as first electrodes for the OLED cells. In one embodiment, the conductive layer is patterned to form strips that serve as, for example, anodes of a pixelated OLED device. The patterning process can also form connections for bond pads. Conventional techniques, such as photolithography and etching, can be used to pattern the conductive layer. Patterning techniques using a stamp are also useful. Such techniques are described in co-pending international patent application titled "Mechanical Patterning of a Device Layer" PCT/SG99/00074 filed Jul. 9, 1999, which is herein incorporated by reference for all purposes.

One or more organic functional layers 310 are formed on the substrate, covering the exposed substrate portions and conductive layer. The functional organic layers comprise, for example, conjugated polymer or low molecular materials such as $Alq_3$. Other types of functional organic layers are also useful. The organic functional layers can be formed by conventional techniques, for example, wet processes such as spin coating or vacuum sublimation (for Alq3 organic layers). The thickness of the organic layers is typically about 2–200 nm.

Figure 4:
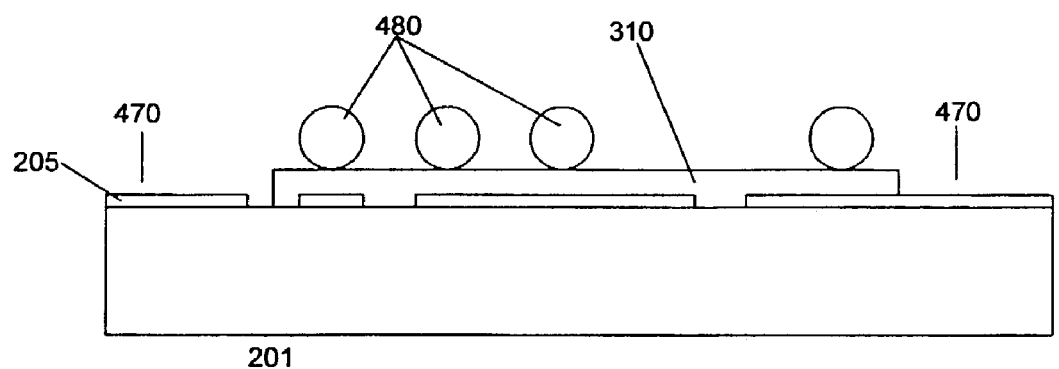

Referring to FIG. 4, portions of the organic layers can be selectively removed to expose underlying layers in regions 470 for bond pad connections. Selective removal of the organic layers can be achieved using, for example, a polishing process. Other techniques, such as etching, scratching, or laser ablation, are also useful.

In accordance with one embodiment of the invention, spacer particles 480 are deposited on the substrate. In one embodiment, the spacer particles comprise a spherical shape. Spacer particles having other geometric shapes, such as cubical, prism, pyramidal, or other regular or irregular shapes are also useful. The average mean diameter of the spacer particles is sufficient to maintain the desired height of the cavity, which for example is about 2–50 $\mu$m. The size and shape distribution of the spacer particles should be sufficiently narrow to ensure proper separation between the cap and OLED cells.

In one embodiment, the spacer particles are randomly distributed on the substrate. Preferably, the spacer particles are randomly distributed in the cell region in which OLED cells are formed. The spacer particles occupy active and non-active parts (e.g., emitting and non-emitting areas) of the device. The distribution or density of the spacer particles should be sufficient to prevent the cap from contacting the OLED cells in the presence of mechanical stress, whether by designed (flexible devices) or accident (handling of the devices). The distribution can be varied to accommodate design requirements, such as the thickness of the 1 cap, thickness of the substrate, and amount of device flexibility needed.

In a preferred embodiment, the spacer distribution is sufficient to maintain the height of the cavity without visibly effecting the emission uniformity of the OLED cells. Typically, a spacer distribution having an average distance between spacer particles of about 10–500 $\mu$m is adequate in preventing the cap from contacting the OLED cells. In one embodiment, the density of the spacer particle distribution is about 10–1000 No/mm$^2$. Such a distribution along with the small size of the spacer particles ensures that their influence on emission uniformity is essentially invisible to the unaided human eye.

To avoid causing shorts between the electrodes, the spacer particles preferably comprise a non-conductive material. In one embodiment, the spacer particles are made of glass. Spacer particles made of other types of non-conductive materials, such as silica, polymers, or ceramic, are also useful.

In embodiment, the spacer particles are deposited by spraying techniques. In a preferred embodiment, a dry spray technique is employed to deposit the spacer particles. Dry spray techniques are described in, for example, Birenda Bahadur (Ed), Liquid Crystals: Applications and Uses, Vol. 1 (ISBN 9810201109), which is incorporated by reference for all purposes.

Dry spray techniques typically comprise electrostatically charging the spacer particles with a first polarity (positive or negative) and the substrate with a second polarity (negative or positive). The spacer particles are blown against the substrate with dry air supplied by a dry air sprayer. Dry air sprayers, such as a DISPA-$\mu$R from Nisshin Engineering Co., can be used. Electrostatic attraction causes the spacer particles to adhere to the substrate while electrostatic repulsion between the particles prevents particle agglomeration on the substrate. A particle density of 160–180 No/mm$^2$ can be achieved using a dry air sprayer which generates dry air, for example, having a dew point $\leq$ −58° C. at pressure of 2 kg/cm$^2$ and a current of 50 l/min for 10 s spray duration. By varying the spraying parameters, other particle densities can be achieved.

The use of a wet spray technique to deposit the spacer particles on the substrate is also useful. Wet spray techniques are described in, for example, Birenda Bahadur (Ed), Liquid Crystals: Applications and Uses, Vol. 1 (ISBN 9810201109), which is already incorporated by reference for all purposes. Typically, the spacer particles are suspended in an alcoholic or aqueous liquids, such as ethanol, isopropanol, or a mixture comprising alcohol and water. The spacer concentration, for example, is about 0.1–0.5% by weight. Ultrasonic waves can be used to disperse the particles to prevent agglomeration. For example, the spacer particles can be irradiated with ultrasonic waves for several minutes prior to particle deposition. The prepared suspension is sprayed with air through a nozzle onto the substrate, depositing the spacer particles thereon.

Figure 5:
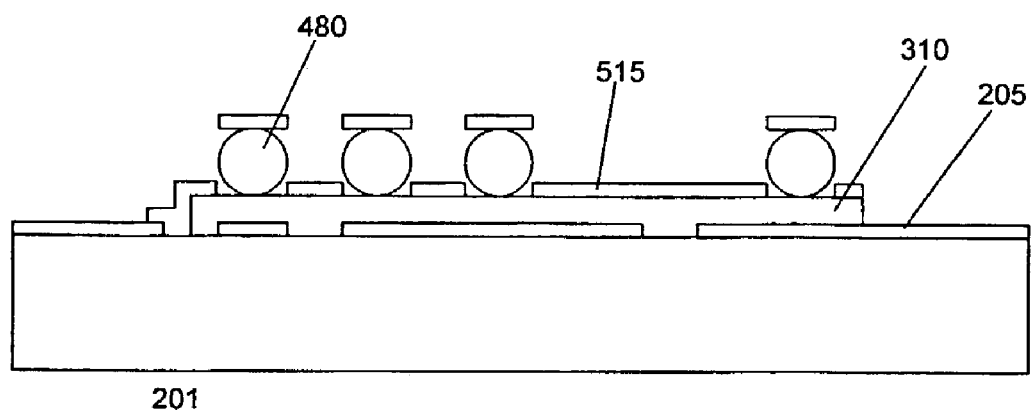

Referring to FIG. 5, a second conductive layer is deposited on the substrate, covering the spacer particles and other layers formed thereon. The conductive layer comprises, for example, a metallic material such as Ca, Mg, Ba, Ag or a mixture or alloy thereof. Other conductive materials, particularly those which comprises a low work function, can also be used to form the second conductive layer. In one embodiment, the second conductive layer is patterned to form electrode strips that serve as cathode for a pixelated OLED device. Also, connections for bond pads can be formed during the patterning process. Alternatively, the conductive layer can be selectively deposited to form cathode strips and bond pad connections. Selective deposition of the conductive layer can be achieved with, for example, mask layers. The cathode strips are typically orthogonal to the anode strips. Forming cathode strips that are diagonal to the anode strips is also useful. The intersections of the top and bottom electrode strips form organic LED pixels.

Figure 6:
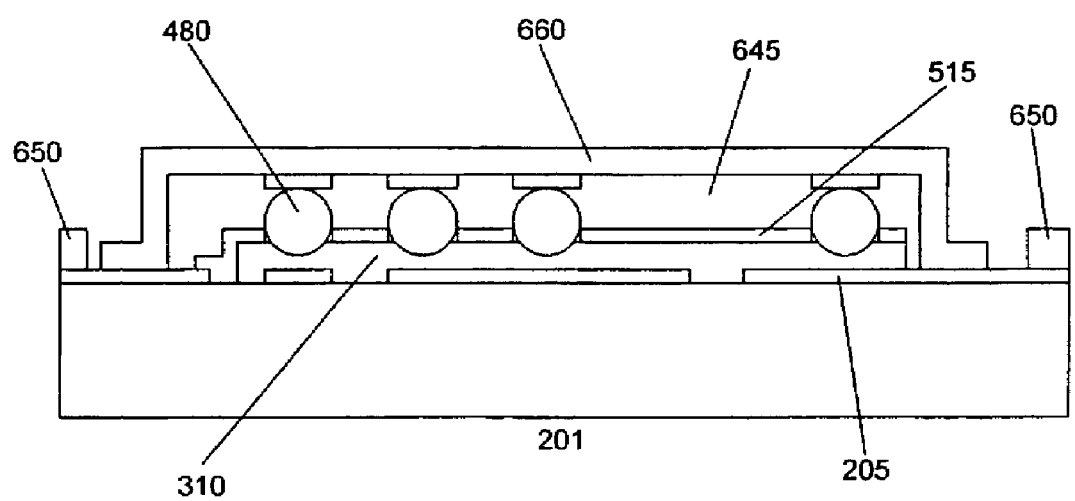

Referring to FIG. 6, a cap 660 is mounted on the substrate to encapsulate the device. The cap layer comprises, for example, metal or glass. Other types of cap which protect the active components from the environment, such as ceramic or metallized foil, are also useful. Various techniques can be used to mount the cap layer. In one embodiment, an adhesive is used to mount the cap layer. Adhesives such as self-hardening adhesives, UV or thermal curable adhesives, or hot melt adhesives are useful. Other techniques which employ low temperature solder materials, ultrasonic bonding, or welding techniques using inductance or laser welding are also useful.

The cap creates a cavity 645, providing separation between it and the OLED cells. During the mounting process, the spacer particles may be pressed into the layers of the OLED cells. The spacer particles provide support for the cap over the area of the OLED cells, preventing the cap from contacting the active components of the device when pressure is applied to the cap. Bond pads 650 are formed to provide electrical access to the OLED cells.

As described, the process deposits the spacer particles after formation of the organic layers. The spacer particles can alternatively be deposited at other points in the process flow. For example, the spacer particles can be deposited before the formation of the first conductive layer, before the formation of the organic layers, or after the formation of the second conductive layer. In effect, the spacer particles can be deposited at any point of the process prior to mounting of the cap.

Spacer particles can also be useful in providing support in other types of devices that employ cavity packages. Such devices include, for example, electrical devices, mechanical devices, electromechanical devices, or microelectromechanical systems (MEMS).

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device comprising:
   a substrate with a device region, wherein the device region includes first and second electrode layers and an organic electroluminescent layer, wherein at least a portion of the first and second electrode layers contact opposite surfaces of the electroluminescent layer;
   a cap for encapsulating the device, the cap creating a cavity over the device region; and
   spacer particles arranged between the first and second electrode layers in the device region and contacting the organic electroluminescent layer to support the cap.

2. The device of claim 1 wherein the device region comprises one or more cells.

3. The device of claim 2 wherein the spacer particles comprise a non-conductive material.

4. The device of claim 1 wherein the spacer particles comprise a non-conductive material.

5. The device of claim 1 wherein the spacer particles are randomly distributed in the device region, occupying active and non-active regions.

6. The device of claim 5 wherein the spacer particles comprise spherical shaped particles.

7. The device of claim 6 wherein the spacer particles have a mean diameter sufficient to maintain a height of the cavity between the cap and substrate.

8. The device of claim 7 wherein the spacer particles have a distribution density sufficient to maintain the cavity.

9. The device of claim 8 wherein the density of the spacer particles is about 10–1000 No/mm$^2$.

10. The device of claim 5 wherein the spacer particles comprise a non-spherical shape.

11. The device of claim 10 wherein the spacer particles comprise different shapes.

12. The device of claim 11 wherein the spacer particles comprise a mean diameter to maintain a height of the cavity between the cap and the substrate.

13. The device of claim 12 wherein the spacer particles comprise a distribution density to maintain the cavity.

14. The device of claim 13 wherein the density of the spacer particles is about 10–1000 No/mm$^2$.

15. The device of claim 10 wherein the spacer particles comprise a mean diameter to maintain a height of the cavity between the cap and the substrate.

16. The device of claim 15 wherein the spacer particles comprise a distribution density to maintain the cavity.

17. The device of claim 16 wherein the density of the spacer particles is about 10–1000 No/mm$^2$.

18. The device of claim 5 wherein the spacer particles comprise a mean diameter to maintain a height of the cavity between the cap and the substrate.

19. The device of claim 18 wherein the spacer particles comprise a distribution density to maintain the cavity.

20. The device of claim 19 wherein the density of the spacer particles is about 10–1000 No/mm$^2$.

21. The device of claim 5 wherein the spacer particles comprise a distribution density to maintain the cavity.

22. The device of claim 21, wherein the density of the spacer particles is about 10–1000 No/mm$^2$.

23. The device of claim 1, wherein:
    the spacer particles are arranged on the first electrodes; and
    the second electrodes are formed over the spacer particles.

24. The device of claim 1 wherein at least a portion of the second electrode layer is formed on at least one of the spacer particles.

25. The device of claim 1 wherein at least one of the spacer particles is between the organic electroluminescent layer and the second electrode layer.

26. A method for forming a device, comprising:
    providing a substrate with a device region, wherein the device region includes a first electrode layer and an organic electroluminescent layer;
    depositing spacer particles on the substrate such that the particles contact the organic electroluminescent layer;
    after depositing the spacer particles, forming a second electrode layer so that at least a first portion of the first and second electrode layers contact opposite surfaces of the organic electroluminescent layer and at least one of the spacer particles is between a second portion of the first and second electrode layers; and
    mounting a cap on the substrate to encapsulate the device so that the cap forms a cavity in the device region supported by spacer particles.

27. The method of claim 26 wherein the substrate is prepared with a conductive layer patterned to form the first electrodes and the organic electroluminescent layer is over the conductive layer.

28. The method of claim 27 wherein the conductive layer comprises a transparent conductive material.

29. The method of claim 28 wherein the spacer particles comprise a non-conductive material.

30. The method of claim 27 wherein the spacer particles comprise a non-conductive material.

31. The method of claim 26 wherein the spacer particles comprise a non-conductive material.

32. The method of claim 29 wherein the spacer particles are deposited by dry spraying.

33. The method of claim 32 wherein the dry spraying comprises:

electrostatically charging the substrate with a first polarity and the spacer particles with a second polarity; and blowing the spacer particles against the substrate with dry air.

34. The method of claim 33 wherein the dry air comprises a dew point of ≦−58° C.

35. The method of claim 30 wherein depositing the spacer particles comprises dry spraying.

36. The method of claim 35 wherein the dry spraying comprises:

electrostatically charging the substrate with a first polarity and the spacer particles with a second polarity; and blowing the spacer particles against the substrate with dry air.

37. The method of claim 36 wherein the dry air comprises a dew point of ≦−58° C.

38. The method of claim 26 wherein depositing the spacer particles comprises dry spraying.

39. The method of claim 38 wherein the dry spraying comprises:

electrostatically charging the substrate with a first polarity and the spacer particles with a second polarity; and blowing the spacer particles against the substrate with dry air.

40. The method of claim 39 wherein the dry air comprises a dew point of ≦−58° C.

41. The method of claim 26 wherein depositing the spacer particles comprises wet spraying.

42. The method of claim 41 wherein the wet spraying comprises:

suspending the spacer particles in a solution; and spraying the solution with the spacer particles on the substrate.

43. The method of claim 42 wherein the solution comprises a concentration of spacer particles of about 0.1–0.5 weight percent.

44. The method of claim 29 wherein depositing the spacer particles comprises wet spraying.

45. The method of claim 44 wherein the wet spraying comprises:

suspending the spacer particles in a solution; and spraying the solution with the spacer particles on the substrate.

46. The method of claim 45 wherein the solution comprises a concentration of spacer particles of about 0.1–0.5 weight percent.

47. The method of claim 30 wherein depositing the spacer particles comprises wet spraying.

48. The method of claim 47 wherein the wet spraying comprises:

suspending the spacer particles in a solution; and spraying the solution with the spacer particles on the substrate.

49. The method of claim 48 wherein the solution comprises a concentration of spacer particles of about 0.1–0.5 weight percent.

50. The method of claim 26 wherein spacer particles are randomly deposited on the substrate.

51. The method of claim 50 further comprising removing the spacer particles from non-device region of the substrate.

52. The method of claim 51 wherein the spacer particles comprise a spherical shape.

53. The method of claim 52 wherein the spacer particles comprise a mean diameter to maintain a height of the cavity between the cap and the substrate.

54. The method of claim 53 wherein the spacer particles are deposited on the substrate with a distribution density to maintain the cavity.

55. The method of claim 54 wherein the spacer particles comprise a non-spherical shape.

56. The method of claim 55 wherein the spacer particles comprise different shapes.

57. The method of claim 56 wherein the spacer particles comprise a mean diameter to maintain a height of the cavity between the cap and the substrate.

58. The method of claim 57 wherein the spacer particles are deposited on the substrate with a distribution density to maintain the cavity.

59. The method of claim 55 wherein the spacer particles comprise a mean diameter to maintain a height of the cavity between the cap and the substrate.

60. The method of claim 59, wherein the spacer particles are deposited on the substrate with a distribution density to maintain the cavity.

61. The method of claim 51 wherein the spacer particles comprise a mean diameter to maintain a height between the cap and the substrate.

62. The method of claim 61 wherein the spacer particles are deposited on the substrate with a distribution density to maintain the cavity.

63. The method of claim 51 wherein the spacer particles are deposited on the substrate with a density to maintain the cavity.

64. A flexible organic electroluminescent device, comprising;

a flexible substrate with a device region having first and second electrode layers and an organic electroluminescent layer;

a cap for encapsulating the device, the cap creating a cavity over the device region; and spacer particles arranged on the flexible substrate in the device region between at least a portion of the first and second electrode layers, supporting the cap and preventing the cap from contacting the device region.

65. The device of claim 64, wherein the flexible substrate includes a plastic film or a flexible glass.

66. The device of claim 64, wherein the spacer particles contact the organic electroluminescent layer.

* * * * *

UNITED STATES PATENT AND TRADEMARK OFFICE
CERTIFICATE OF CORRECTION

PATENT NO. : 6,949,880 B1
APPLICATION NO. : 10/168058
DATED : September 27, 2005
INVENTOR(S) : Ewald Karl Michael Guenther and Hagen Klausmann It is certified that error appears in the above-identified patent and that said Letters Patent is hereby corrected as shown below:

On the title page, References Cited: Item [56]
 U.S. Patent Documents: please add the following references:
  6,649,221 B1 published 11-2003 under Tateno et.al.
  US 2003/0094691 A1 published 05-2003 under Auch et. al.
 Foreign Patent Documents: please add the following references:
  EP 0910228 published 04-1999
  WO 01/45140 published 06-2001
  WO 01/44865 published 06-2001
  WO 01/39174 published 05-2001
  WO 01/04938 published 01-2001
 Other Publications: please add the following references:
  Hayes, D.J. et al., "Low-cost display assembly and interconnect using ink–jet printing technology", Journal of the SID (Society for Information Display), Sept. 2001, pp. 9-13.
  Birenda Bahadur (Ed) "Liquid Crystals: Applications and Uses", 1990, London, Volume 1, pp. 171-194, 397-436, ISBN 9810201109.
In the claims:
 In claim 4, column 5, line 51; Replace:
  "anon-conductive material" with
  -- a non-conductive material --
 In claim 64, column 8, line 40-41; Replace:
  "comprising;" with
  -- comprising: --

Signed and Sealed this

Fourteenth Day of November, 2006

JON W. DUDAS
*Director of the United States Patent and Trademark Office*